United States Patent
Yang

(10) Patent No.: US 12,376,434 B2
(45) Date of Patent: Jul. 29, 2025

(54) DISPLAY BACKPLATE WITH REDUCED THICKNESS

(71) Applicant: WUHAN CHINA STAR OPTOELECTRONICS SEMICONDUCTOR DISPLAY TECHNOLOGY CO., LTD., Hubei (CN)

(72) Inventor: Chaoqun Yang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/618,466

(22) PCT Filed: Nov. 30, 2021

(86) PCT No.: PCT/CN2021/134596
§ 371 (c)(1),
(2) Date: Dec. 11, 2021

(87) PCT Pub. No.: WO2023/087396
PCT Pub. Date: May 25, 2023

(65) Prior Publication Data
US 2024/0038941 A1    Feb. 1, 2024

(30) Foreign Application Priority Data
Nov. 16, 2021   (CN) .......................... 202111351994.8

(51) Int. Cl.
*H10H 20/851*   (2025.01)
*H10H 20/852*   (2025.01)
(Continued)

(52) U.S. Cl.
CPC ...... *H10H 20/8512* (2025.01); *H10H 20/852* (2025.01); *H10H 20/855* (2025.01); *H10H 20/0361* (2025.01)

(58) Field of Classification Search
CPC ....... H01L 33/502; H01L 33/52; H01L 33/58; H10H 20/8512; H10H 29/8506; H10H 20/855
See application file for complete search history.

(56) References Cited

U.S. PATENT DOCUMENTS

2011/0114970 A1*   5/2011   Teng ................... H01L 25/0756
                                                            257/E33.072
2017/0256591 A1*   9/2017   Li ..................... G02F 1/133617
(Continued)

FOREIGN PATENT DOCUMENTS

CN   102082224 A   6/2011
CN   109003967 A   12/2018
(Continued)

OTHER PUBLICATIONS

International Search Report in International application No. PCT/CN2021/134596, mailed on Jul. 29, 2022.
(Continued)

*Primary Examiner* — Eliseo Ramos Feliciano
*Assistant Examiner* — Mikka Liu
(74) *Attorney, Agent, or Firm* — PV IP PC; Wei Te Chung

(57) ABSTRACT

A quantum-dot thin film, a display backplate, and a manufacturing method of the display backplate are provided. The display backplate includes a light-emitting module and a quantum-dot module. The light-emitting module includes a light-emitting main body and a composite protective functional layer which are stacked. The quantum-dot module includes a quantum-dot layer disposed on the composite
(Continued)

protective functional layer and a common protective functional layer disposed on the quantum-dot layer. A thickness of the composite protective functional layer is less than a thickness of the common protective functional layer.

16 Claims, 5 Drawing Sheets

(51) Int. Cl.
  *H10H 20/855* (2025.01)
  *H10H 20/01* (2025.01)

(56) References Cited

U.S. PATENT DOCUMENTS

| | | | |
|---|---|---|---|
| 2019/0146277 A1 | 5/2019 | Ajichi | |
| 2021/0036073 A1* | 2/2021 | Cho | H10K 59/80522 |
| 2021/0074770 A1* | 3/2021 | Choe | G02B 5/201 |

FOREIGN PATENT DOCUMENTS

| | | | |
|---|---|---|---|
| CN | 109937491 A | 6/2019 | |
| CN | 111240095 A | 6/2020 | |

OTHER PUBLICATIONS

Written Opinion of the International Search Authority in International application No. PCT/CN2021/134596, mailed on Jul. 29, 2022.

\* cited by examiner

Providing a light-emitting module. The light-emitting module includes a light-emitting main body and a composite protective functional layer. A surface of a side of the light-emitting main body close to the composite protective functional layer is in contact with and is connected to a surface of a side of the composite protective functional layer close to the light-emitting main body. Wherein, the light-emitting main body includes a substrate and a plurality of light-emitting components formed on the substrate. Furthermore, the composite protective functional layer covers the light-emitting components. ⟶ S10

Providing a quantum-dot module. The quantum-dot module includes a quantum-dot layer and a common protective functional layer which are stacked. A thickness of the composite protective functional layer is less than a thickness of the common protective functional layer. ⟶ S20

Attaching a side of the light-emitting module having the composite protective functional layer to a side of the quantum-dot module having the quantum-dot layer to form a display backplate. ⟶ S30

FIG. 4

DISPLAY BACKPLATE WITH REDUCED THICKNESS

FIELD

The present disclosure relates to the field of display technologies, and more particularly, to a quantum-dot thin film, a display backplate, and a manufacturing method of the display backplate.

BACKGROUND

Backlight technologies of liquid crystal displays (LCDs) have launched multiple generations as they have been continuously developed. Development of the backlight technologies is from cold cathode fluorescent lamp (CCFL) backlights to surface-mount device light-emitting diode (SMD LED) backlights, and further to mini LED backlights, improving a display effect of the LCDs and allowing people to have a viewing experience with an extremely high definition.

LED lamp components having three colors of red, green, and blue (RGB) can be directly applied to mini LED backlights, thereby realizing a display effect without losing three primary colors of RGB. Colorfulness of the mini LED backlights can rival colorfulness of organic light-emitting diodes (OLEDs). In addition, even heat dissipation of the mini LED backlights can be realized when the mini LED backlights are in a high brightness mode. This cannot be realized by conventional separated LCD devices. Furthermore, the mini LED backlights can realize a direct-lit LCD, which is beneficial for development of a thinner and lighter body to be used in augmented reality (AR)/virtual reality (VR) glasses, cell phones, or notebooks.

Currently, in blue mini LED backlights, a blue mini LED lamp plate is commonly cooperated with a quantum-dot thin film to form a backlight source to emit light. However, conventional quantum-dot thin films include multiple layers such as a quantum-dot film and base material layers disposed on two sides of the quantum-dot film. Therefore, conventional quantum-dot thin films are relatively thick and will increase an entire thickness of mini LED backlights when they are attached to a mini LED lamp plate, which cannot satisfy requirements of mini LED backlights having a thin and light body.

SUMMARY

Embodiments of the present disclosure provide a quantum-dot thin film, a display backplate, and a manufacturing method of the display backplate, which can reduce a thickness of display backplates to satisfy requirements of backlights having a thin and light body.

An embodiment of the present disclosure provides a display backplate, comprising:

a light-emitting module, comprising a light-emitting main body and a composite protective functional layer, wherein a surface of a side of the light-emitting main body close to the composite protective functional layer is in contact with and is connected to a surface of a side of the composite protective functional layer close to the light-emitting main body, the light-emitting main body comprises a substrate and a plurality of light-emitting components disposed on the substrate, and the composite protective functional layer covers the light-emitting components; and a quantum-dot module disposed on the light-emitting module, wherein the quantum-dot module comprises a quantum-dot layer disposed on the composite functional layer and a common protective functional layer disposed on a side of the quantum-dot layer away from the composite protective functional layer, and a thickness of the composite protective functional layer is less than a thickness of the common protective functional layer.

In an embodiment of the present disclosure, a difference between the thickness of composite protective functional layer and the thickness of the common protective functional layer is greater than 5 μm.

In an embodiment of the present disclosure, a plurality of first diffusion particles are distributed in the composite protective functional layer.

In an embodiment of the present disclosure, the light-emitting body comprises an encapsulation adhesive layer disposed on the substrate, the encapsulation adhesive layer is disposed between the light-emitting components adjacent to each other, and a plurality of second diffusion particles are distributed in the encapsulation adhesive layer.

In an embodiment of the present disclosure, the composite protective functional layer covers an upper surface of the light-emitting components and fills between the light-emitting components adjacent to each other.

In an embodiment of the present disclosure, the light-emitting main body comprises a light extraction layer disposed on the light-emitting components, and the composite protective functional layer covers the light extraction layer.

In an embodiment of the present disclosure, the light extraction layer covers an upper surface of the light-emitting components and fills between the light-emitting components adjacent to each other.

In an embodiment of the present disclosure, a refractive index of a material of the light extraction layer is greater than or equal to 1.2.

In an embodiment of the present disclosure, the light-emitting components comprise a blue light-emitting diode (LED) component, and the display panel comprises a blue-light-transmitting film disposed between the light-emitting module and the quantum-dot module.

To achieve the above goal, the present disclosure further provides a method of manufacturing a display backplate, comprising following steps:

providing a light-emitting module, wherein the light-emitting module comprises a light-emitting main body and a composite protective functional layer, wherein a surface of a side of the light-emitting main body close to the composite protective functional layer is in contact with and is connected to a surface of a side of the composite protective functional layer close to the light-emitting main body, the light-emitting main body comprises a substrate and a plurality of light-emitting components disposed on the substrate, and the composite protective functional layer covers the light-emitting components;

providing a quantum-dot module, wherein the quantum-dot module comprises a quantum-dot layer and a common protective functional layer which are stacked, and a thickness of the composite protective functional layer is less than a thickness of the common protective functional layer; and attaching a side of the light-emitting module having the composite protective functional layer to a side of the quantum-dot module having the quantum-dot layer, thereby forming the display backplate.

In an embodiment of the present disclosure, a difference between the thickness of the composite protective functional layer and the thickness of the common protective functional layer is greater than 5 μm.

In an embodiment of the present disclosure, the step of providing the light-emitting module comprises a following step:

Forming a base material on the light-emitting main body, and performing a lamination process on the base material to obtain the composite protective functional layer; wherein a plurality of first diffusion particles are distributed in the base material.

In an embodiment of the present disclosure, the step of providing the light-emitting module comprises a following step:

forming an encapsulation adhesive layer and a light extraction layer between the substrate and the composite protective functional layer to form the light-emitting main body, wherein the encapsulation adhesive layer is formed on the substrate and is located between the light-emitting components adjacent to each other, the light extraction layer is formed between the encapsulation adhesive layer and the composite protective functional layer, and the light extraction layer covers an upper surface of the light-emitting components and fills between the light-emitting components adjacent to each other; and wherein a plurality of second diffusion particles are distributed in the encapsulation adhesive layer, and a refractive index of a material of the light extraction layer is greater than or equal to 1.2.

In an embodiment of the present disclosure, the composite protective functional layer covers an upper surface of the light-emitting components and fills between the light-emitting components adjacent to each other.

In an embodiment of the present disclosure, the step of providing the quantum-dot module comprises following steps:

providing a quantum-dot thin film, wherein the quantum-dot thin film comprises the quantum-dot layer, and the common protective functional layer and a moisture and oxygen blocking release film respectively disposed on two opposite sides of the quantum-dot layer; and removing the moisture and oxygen blocking release film disposed on the side of the quantum-dot layer to form the quantum-dot module.

In an embodiment of the present disclosure, the moisture and oxygen blocking release film comprises a release film main body and a moisture and oxygen blocking layer, and the moisture and oxygen blocking layer is disposed on a side of the quantum-dot main body away from the quantum-dot layer.

To achieve the above goal, the present disclosure further provides a quantum-dot thin film, comprising:

a quantum-dot layer;

a common protective functional layer disposed on a side of the quantum-dot layer; and a moisture and oxygen blocking release film disposed on a side of the quantum-dot layer away from the common protective functional layer.

In an embodiment of the present disclosure, the moisture and oxygen blocking release film comprises a release film main body and a moisture and oxygen blocking layer, and the moisture and oxygen blocking layer is disposed on a side of the quantum-dot main body away from the quantum-dot layer.

Regarding the beneficial effects: compared with conventional technologies, in the present disclosure, a composite protective functional layer is disposed in a light-emitting module. A quantum-dot module includes a quantum-dot layer and a common protective functional layer which are stacked. A thickness of the composite protective functional layer is less than a thickness of the common protective functional layer. Therefore, an entire thickness of a display panel can be reduced, thereby satisfying requirements of backlights having a thin and light body.

DESCRIPTION OF DRAWINGS

Technical solutions and beneficial effects of the present disclosure are illustrated below in detail in conjunction with drawings and specific embodiments.

FIG. 4 is a flowchart showing a method of manufacturing a display plate provided by an embodiment of the present disclosure.

DETAILED DESCRIPTION

Figure 1:
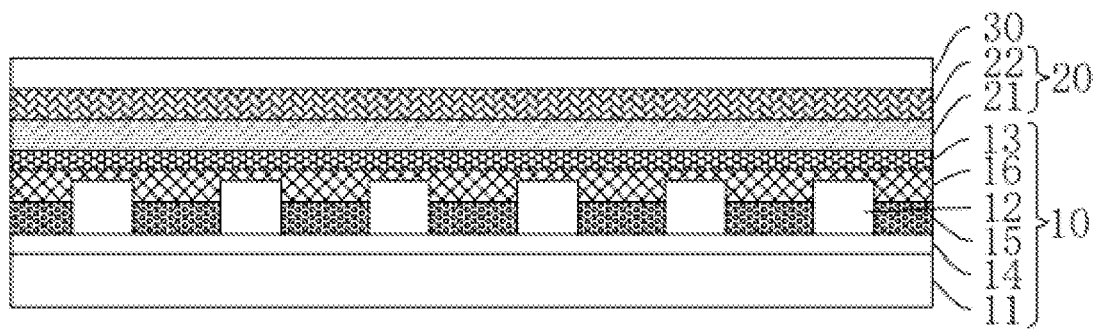
FIG. 1 is a structural schematic view showing a display backplate provided by an embodiment of the present disclosure.

Hereinafter preferred embodiments of the present disclosure will be described with reference to the accompanying drawings to exemplify the embodiments of the present disclosure can be implemented, which can fully describe the technical contents of the present disclosure to make the technical content of the present disclosure clearer and easy to understand. However, the described embodiments are only some of the embodiments of the present disclosure, but not all of the embodiments. All other embodiments obtained by those skilled in the art based on the embodiments of the present disclosure without creative efforts are within the scope of the present disclosure.

The disclosure below provides many different embodiments or examples for realizing different structures of the present disclosure. In order to simplify the disclosure of the present disclosure, components and settings of specific examples are described below. Of course, they are only examples and are not intended to limit the present disclosure. Furthermore, reference numbers and/or letters may be repeated in different examples of the present disclosure. Such repetitions are for simplification and clearness, which per se do not indicate the relations of the discussed embodiments and/or settings. Moreover, the present disclosure provides examples of various specific processes and materials, but the applicability of other processes and/or application of other materials may be appreciated by a person skilled in the art.

An embodiment of the present disclosure provides a display backplate. Please refer to FIG. 1, the display backplate provided by the embodiment of the present disclosure includes a light-emitting module 10 and a quantum-dot module 20.

Wherein, the light-emitting module 10 includes a light-emitting main body and a composite protective functional layer 13. A surface of a side of the light-emitting main body close to the composite protective functional layer 13 is in contact with and is connected to a surface of a side of the composite protective functional layer 13 close to the light-emitting main body. Wherein, the light-emitting main body includes a substrate 11, a plurality of light-emitting components 12 disposed on the substrate 11, and a composite protective functional layer 13 covering the light-emitting components 12.

The quantum-dot module 20 is disposed on the light-emitting module 10. The quantum-dot module 20 includes a quantum-dot layer 21 disposed on the composite protective functional layer 13 and a common protective functional layer 22 disposed on a side of the quantum-dot layer 21 away from the composite protective functional layer 13.

Furthermore, a thickness of the composite protective functional layer 13 is less than a thickness of the common protective functional layer 22.

It should be noted that, in the present embodiment, the surface of the side of the light-emitting main body close to the composite functional layer 13 is in contact with and is connected to the surface of the side of the composite protective functional layer 13. That is, the composite protective functional layer 13 is directly disposed on the surface of the side of the light-emitting main body. It is not necessary to dispose an adhesive layer between the light-emitting main body and the composite functional layer 13 to attach them.

In practical applications, the composite protective functional layer 13 is disposed in the light-emitting module 10. The quantum-dot module 20 includes the quantum-dot layer 21 and the common protective functional layer 22 which are stacked. The thickness of the composite protective functional layer 13 is less than the thickness of the common protective functional layer 22. In conventional technologies, two base material layers are respectively disposed on two sides of a quantum-dot thin film. The base material layers must be enough thick to protect and support the quantum-dot thin film. On the contrary, in the present embodiment, since the composite protective functional layer 13 is directly disposed in the light-emitting module 10, it is not necessary to consider functions of the composite protective functional layer 13 to protect and support the quantum-dot module 20 and the quantum-dot layer 21. As such, the composite protective functional layer 13 can be thinner. For example, the composite protective functional layer 13 can be directly formed in the light-emitting module 10 by a lamination process or a coating process. Therefore, the thickness of the composite protective functional layer 13 can be less than the thickness of the common protective functional layer 22 disposed in the quantum-dot module 20 and is less than the thickness of the base material layers disposed on two sides of the conventional quantum-dot thin film. As such, an entire thickness of the display panel can be reduced, thereby satisfying requirements of backlights having a thin and light body.

Specifically, the display backplate provided by the present disclosure are described in detail below in conjunction with specific embodiments.

Please refer to FIG. 1 again, in an embodiment of the present disclosure, the display backplate includes the light-emitting module 10 and the quantum-dot module 20 disposed on the light-emitting module 10.

Optionally, the light-emitting module 10 may include a blue backlight source which can cooperate with red light, green light, and blue light emitted from the quantum-dot module 20 to form mixing white light.

Furthermore, the light-emitting module 10 includes a substrate 11, a reflective layer 14 disposed on the substrate 11, the light-emitting components 12 disposed on a side of the reflective layer 14 away from the substrate 11, and an encapsulation adhesive layer 15 disposed on a side of the reflective layer 14 away from the substrate 11. The light-emitting components 12 may be arranged on the reflective layer 14 in an array manner. The encapsulation adhesive layer 15 is disposed between the light-emitting components 12 adjacent to each other to fix each of the light-emitting components 12.

Optionally, the reflective layer 14 may include a white ink material, which is not limited here. The light-emitting components 12 may be blue LED lamp components which can emit blue light. Furthermore, the light-emitting components 12 may be blue mini LED lamp components, thereby further improving a light-emitting effect of the display backplate provided by the embodiment of the present disclosure.

In the present embodiment, the light-emitting module 10 further includes a light extraction layer 16 disposed on a side of the encapsulation adhesive layer 15 away from the substrate 11 and the composite protective functional layer 13 laminated on a side of the light extraction layer 16 away from the encapsulation adhesive layer 15. Wherein, the light extraction layer 16 is filled between the light-emitting components 12 adjacent to each other and covers an upper surface of each of the light-emitting components 12. The composite protective functional layer 13 may directly cover the side of the light extraction layer 16 away from the encapsulation adhesive layer 15. In the present embodiment, the substrate 11, the reflective layer 14, the light-emitting components 12, the encapsulation adhesive layer 15, and the light extraction layer 16 together form the light-emitting main body, and the composite protective functional layer 13 is directly disposed on a surface of a side of the light-emitting main body.

A plurality of first diffusion particles are distributed in the composite protective functional layer 13. A plurality of second diffusion particles are distributed in the encapsulation adhesive layer 15. Because the encapsulation adhesive layer 15 surrounds the light-emitting components 12 and the composite protective functional layer 13 covers the light-emitting components 12, light emitted from the light-emitting components 12 can be diffused in all directions, thereby improving a light-emitting effect of the light-emitting module 10.

In addition, the light extraction 16 includes a material having high refractive index. Specifically, a refractive index of the material of the light extraction 16 is greater than or equal to 1.2. The material of the light extraction layer may include an acrylic resin and is not limited here.

A material of the composite protective functional layer 13 includes polyethylene terephthalate (PET), poly(methyl methacrylate) (PMMA), polycarbonate (PC), or polyethylene naphthalate two formic acid glycol ester (PEN).

Optionally, the first diffusion particles and the second diffusion particles are individually selected from at least one of an organic diffusion particle or an inorganic diffusion particle. Specifically, the organic diffusion particle may include a silicone material, a polystyrene material, or a polycarbonate material. The inorganic diffusion particle may include $TiO_2$, $ZrO_2$, $Al_2O_3$, or $BaTiO_3$.

It should be understood that, in the present embodiment, the light extraction layer 16 and the composite protective functional layer 13, which are stacked, are disposed on a light-emitting side of the light-emitting components 12. Furthermore, the light extraction layer 16 is made of the material having high refractive index. The first diffusion particles are distributed in the composite protective functional layer 13. Therefore, a light diffusion effect can be improved. Cooperation between the light extraction layer 16 and the composite protective functional layer 13 can further improve uniformity of mixing light emitted from the display backplate. Also, a light extraction rate can be increased. Therefore, diffusion plates disposed in conventional backlight modules can be omitted. In conventional display modules, a diffusion plate is disposed on a lamp plate, leading to a relatively great thickness. In the present embodiment, the light extraction layer 16 is directly disposed between the light-emitting components 12 and is directly disposed on the upper surface of the light-emitting components 12. The composite protective functional layer 13 is directly laminated on the light extraction layer 16. Therefore, a thickness of the light extraction layer 16 and a thickness of the composite protective functional layer 13 can be significantly reduced, making a total thickness of the light extraction layer 16 and the composite protective functional layer 13 less than a thickness of conventional diffusion plates. This can reduce a thickness of the display backplate by 50 μm to 100 μm.

Furthermore, the quantum-dot module 20 includes the quantum-dot layer 21 disposed on the composite protective functional layer 13 and the common protective functional layer 22 disposed on the side of the quantum-dot layer 21 away from the composite protective functional layer 13. It should be noted that a material of the common protective functional layer 22 and the material of the composite protective functional layer 13 may be same. For example, the material of the common protective functional layer 22 may include PET, PMMA, PC, or PEN.

In addition, the display backplate includes a brightness enhancement film 30 disposed on a side of the quantum-dot module 20 away from the light-emitting module 10, thereby further increasing a brightness of the display backplate. Specifically, the brightness enhancement film 30 is disposed on a side of the common protective functional layer 22 away from the quantum-dot layer 21.

In the present embodiment, the thickness of the composite protective functional layer 13 is less than the thickness of the common protective functional layer 22. A difference between the thickness of the composite protective functional layer 13 and the thickness of the common protective functional layer 22 is greater than 5 μm. The composite protective functional layer 13 and the common protective functional layer 22 are respectively disposed on two sides of the quantum-dot layer 21, thereby blocking moisture and oxygen from entering from two sides of the quantum-dot layer 21. In conventional technologies, two same base material layers are respectively disposed on two sides of a quantum-dot thin film. In the present embodiment, the composite protective functional layer 13 can be laminated in the light-emitting module 10, thereby reducing the thickness of the common protective functional layer 22 disposed on the side of the quantum-dot layer 21. As such, an entire thickness of the display backplate can be reduced, thereby realizing backlights having a thin and light body.

Figure 2:
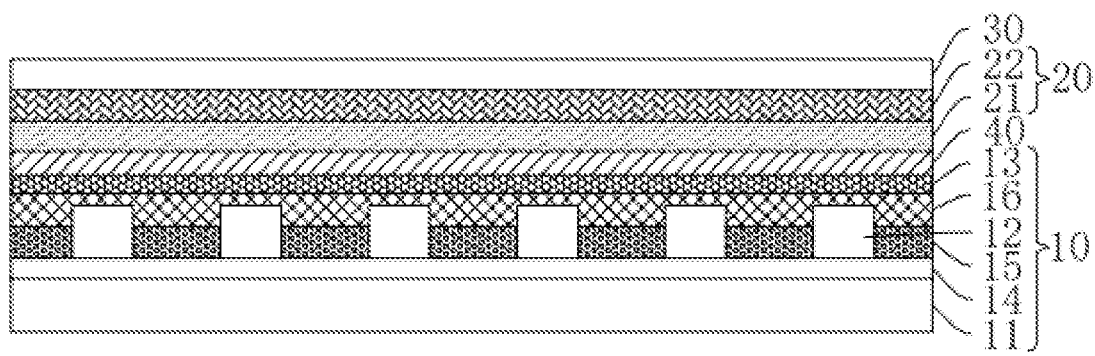
FIG. 2 is a structural schematic view showing another display backplate provided by an embodiment of the present disclosure.

In another embodiment of the present disclosure. Please refer to FIG. 2. A display backplate includes a light-emitting module 10, a blue-light-transmitting film 40 disposed on the light-emitting module 10, and a quantum-dot module 20 disposed on a side of the blue-light-transmitting film 40 away from the light-emitting module 10.

Optionally, the light-emitting module 10 may include a blue backlight source which can cooperate with the blue-light-transmitting film 40 to increase amount and intensity of blue light. Furthermore, the quantum-dot module 20 can convert blue light into red light and green light, which can cooperate with blue light emitted from the light-emitting module 10 to form mixing white light.

Furthermore, the light-emitting module 10 includes a substrate 11, a reflective layer 14 disposed on the substrate 11, the light-emitting components 12 disposed on a side of the reflective layer 14 away from the substrate 11, and an encapsulation adhesive layer 15 disposed on a side of the reflective layer 14 away from the substrate 11. The light-emitting components 12 may be arranged on the reflective layer 14 in an array manner. The encapsulation adhesive layer 15 is disposed between the light-emitting components 12 adjacent to each other to fix each of the light-emitting components 12.

Optionally, the reflective layer 14 may include a white ink material, which is not limited here. The light-emitting components 12 may be blue LED lamp components which can emit blue light. Furthermore, the light-emitting components 12 may be blue mini LED lamp components, thereby further improving a light-emitting effect of the display backplate provided by the embodiment of the present disclosure.

In the present embodiment, the light-emitting module 10 further includes a light extraction layer 16 disposed on a side of the encapsulation adhesive layer 15 away from the substrate 11 and the composite protective functional layer 13 laminated on a side of the light extraction layer 16 away from the encapsulation adhesive layer 15. Wherein, the light extraction layer 16 is filled between the light-emitting components 12 adjacent to each other and covers an upper surface of each of the light-emitting components 12. The composite protective functional layer 13 may directly cover the side of the light extraction layer 16 away from the encapsulation adhesive layer 15. In the present embodiment, the substrate 11, the reflective layer 14, the light-emitting components 12, the encapsulation adhesive layer 15, and the light extraction layer 16 together form the light-emitting main body, and the composite protective functional layer 13 is directly disposed on a surface of a side of the light-emitting main body.

A plurality of first diffusion particles are distributed in the composite protective functional layer 13. A plurality of second diffusion particles are distributed in the encapsulation adhesive layer 15. Because the encapsulation adhesive layer 15 surrounds the light-emitting components 12 and the composite protective functional layer 13 covers the light-emitting components 12, light emitted from the light-emitting components 12 can be diffused in all directions, thereby improving a light-emitting effect of the light-emitting module 10.

In addition, the light extraction 16 includes a material having high refractive index. Specifically, a refractive index of the material of the light extraction 16 is greater than or equal to 1.2. The material of the light extraction layer may include an acrylic resin and is not limited here.

A material of the composite protective functional layer 13 includes PET, PMMA, polycarbonate PC, or PEN.

Optionally, the first diffusion particles and the second diffusion particles are individually selected from at least one of an organic diffusion particle or an inorganic diffusion particle. Specifically, the organic diffusion particle may include a silicone material, a polystyrene material, or a polycarbonate material. The inorganic diffusion particle may include $TiO_2$, $ZrO_2$, $Al_2O_3$, or $BaTiO_3$.

It should be understood that, in the present embodiment, the light extraction layer 16 and the composite protective functional layer 13, which are stacked, are disposed on a light-emitting side of the light-emitting components 12. Furthermore, the light extraction layer 16 is made of the material having high refractive index. The first diffusion particles are distributed in the composite protective functional layer 13. Therefore, a light diffusion effect can be improved. Cooperation between the light extraction layer 16 and the composite protective functional layer 13 can further improve uniformity of mixing light emitted from the display backplate. Also, a light extraction rate can be increased. Therefore, diffusion plates disposed in conventional backlight modules can be omitted. In conventional display modules, a diffusion plate is disposed on a lamp plate, leading to a relatively great thickness. In the present embodiment, the light extraction layer 16 is directly disposed between the light-emitting components 12 and is directly disposed on the upper surface of the light-emitting components. The composite protective functional layer 13 is directly laminated on the light extraction layer 16. Therefore, a thickness of the light extraction layer 16 and a thickness of the composite protective functional layer 13 can be significantly reduced, making a total thickness of the light extraction layer 16 and the composite protective functional layer 13 less than a thickness of conventional diffusion plates. This can reduce a thickness of the display backplate by 50 μm to 100 μm.

The blue-light-transmitting film 40 is disposed on a side of the composite protective functional layer 13 away from the light extraction layer 16. A material of the blue-light-transmitting film 40 may include PET, PMMA, PC, or PEN.

Furthermore, the quantum-dot module 20 includes the quantum-dot layer 21 disposed on the blue-light-transmitting film 40 and the common protective functional layer 22 disposed on the side of the quantum-dot layer 21 away from the blue-light-transmitting film 40. It should be noted that a material of the common protective functional layer 22 and the material of the composite protective functional layer 13 may be same. For example, the material of the common protective functional layer 22 may include PET, PMMA, PC, or PEN.

In addition, the display backplate includes a brightness enhancement film 30 disposed on a side of the quantum-dot module 20 away from the blue-light-transmitting film 40, thereby further increasing a brightness of the display backplate. Specifically, the brightness enhancement film 30 is disposed on a side of the common protective functional layer 22 away from the quantum-dot layer 21.

In the present embodiment, the thickness of the composite protective functional layer 13 is less than the thickness of the common protective functional layer 22. A difference between the thickness of the composite protective functional layer 13 and the thickness of the common protective functional layer 22 is greater than 5 μm. The composite protective functional layer 13 and the common protective functional layer 22 are respectively disposed on two sides of the quantum-dot layer 21, thereby blocking moisture and oxygen from entering from two sides of the quantum-dot layer. In conventional technologies, two same base material layers are respectively disposed on two sides of a quantum-dot thin film. In the present embodiment, the composite protective functional layer 13 can be laminated in the light-emitting module 10, thereby reducing the thickness of the common protective functional layer 22 disposed on a side of the quantum-dot layer 21. As such, an entire thickness of the display backplate can be reduced, thereby realizing backlights having a thin and light body. In addition, in the present embodiment, the blue-light-transmitting film 40 is further disposed between the light-emitting module 10 and the quantum-dot module 20, thereby increasing amount and intensity of blue light emitted from light-emitting module 10. Therefore, a brightness of the display backplate provided by the present embodiment is further increased.

It should be noted that, in the present embodiment, the composite protective functional layer 13 is laminated in the light-emitting module 10. Therefore, compared with the common protective functional layer 22, the composite protective functional layer 13 can have a reduced thickness, thereby reducing a thickness of the display backplate. However, the feature "the composite protective functional layer 13 is laminated" is only a description example, and the present disclosure is not limited thereto. The composite protective functional layer 13 may also be directly disposed in the light-emitting module 10 by other methods.

Furthermore, in other embodiments of the present disclosure, a light-emitting main body includes a substrate 11, a reflective layer 14 disposed on the substrate 11, a plurality of light-emitting components 12 disposed on the reflective layer 14, and an encapsulation adhesive layer 15 disposed on the reflective layer 14 and disposed between the light-emitting components 12 adjacent to each other. In the present embodiment, the light-emitting main body is not provided with a light extraction layer 16, and the composite protective functional layer 13 is directly disposed on the light-emitting components 12 and the encapsulation adhesive layer 15. That is, the composite protective functional layer 13 covers an upper surface of the light-emitting components 12 and fills between the light-emitting components 12, thereby covering an upper surface of the encapsulation layer 15. In the present embodiment, the composite protective functional layer 13 and the light-emitting main body can form an inter-embedded structure, thereby improving connection strength between the composite protective functional layer 13 and the light-emitting main body.

In addition, an embodiment of the present disclosure further provides a quantum-dot thin film. The quantum-dot thin film can be configured to form the display backplate of the above-mentioned embodiments.

Figure 3:
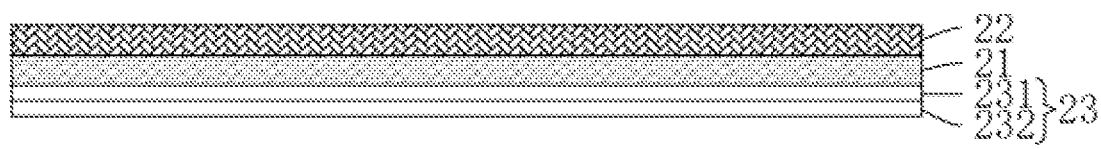
FIG. 3 is a structural schematic view showing a quantum-dot thin film provided by an embodiment of the present disclosure.
Figure 5A:
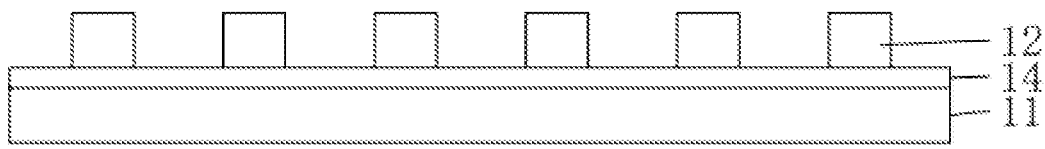
FIGS. 5A to 5E are structural views showing a display backplate provided by an embodiment of the present disclosure during manufacturing processes.
Figure 5B:
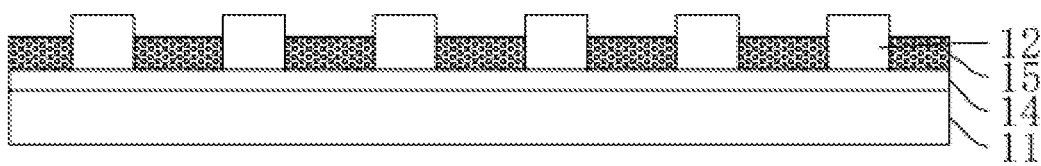
Figure 5C:
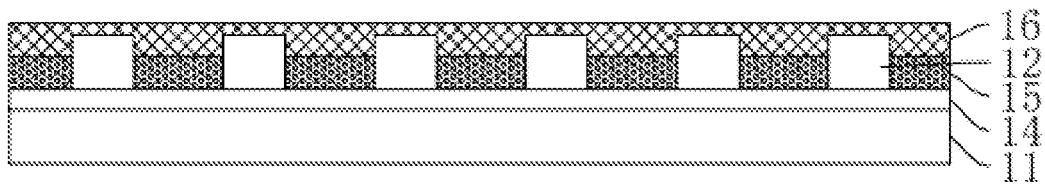
Figure 5D:
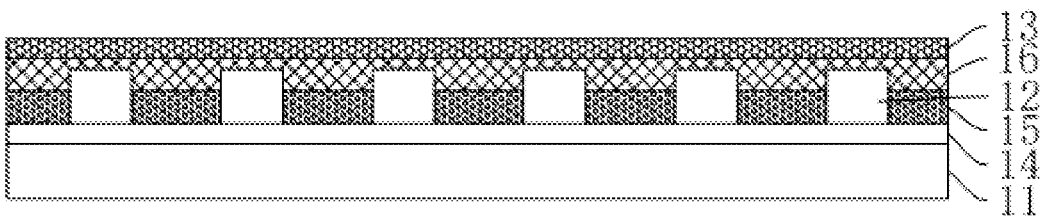
Figure 5E:
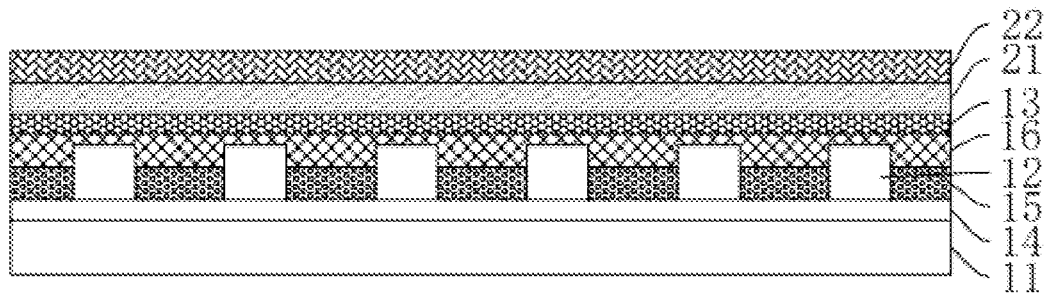
Figure 6A:
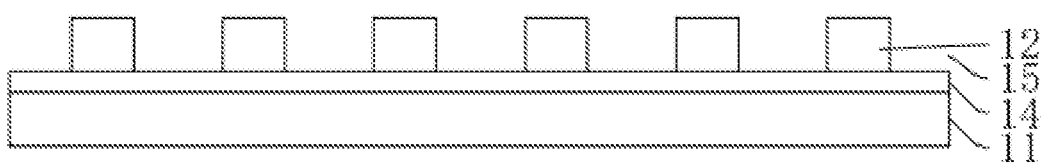
FIGS. 6A to 6E are structural views showing another display backplate provided by an embodiment of the present disclosure during manufacturing processes.
Figure 6B:
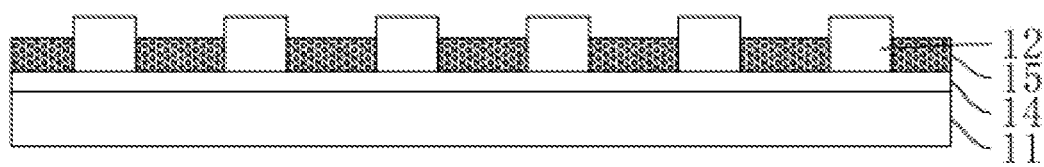
Figure 6C:
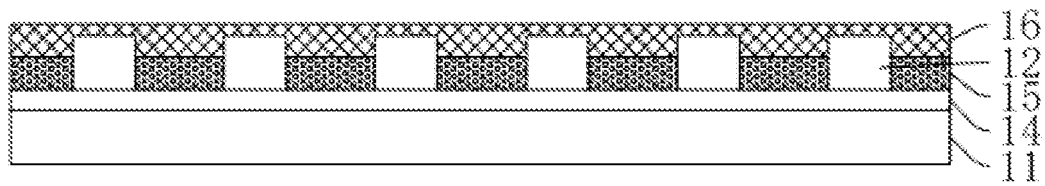
Figure 6D:
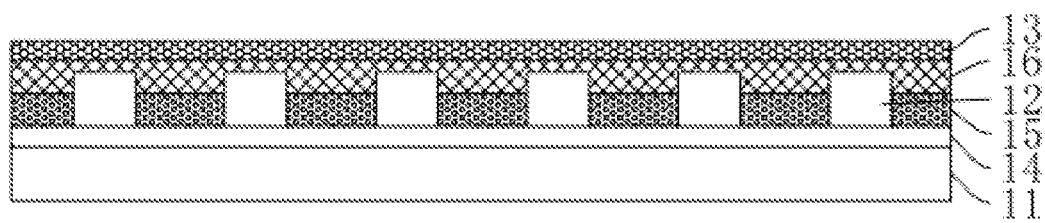
Figure 6E:
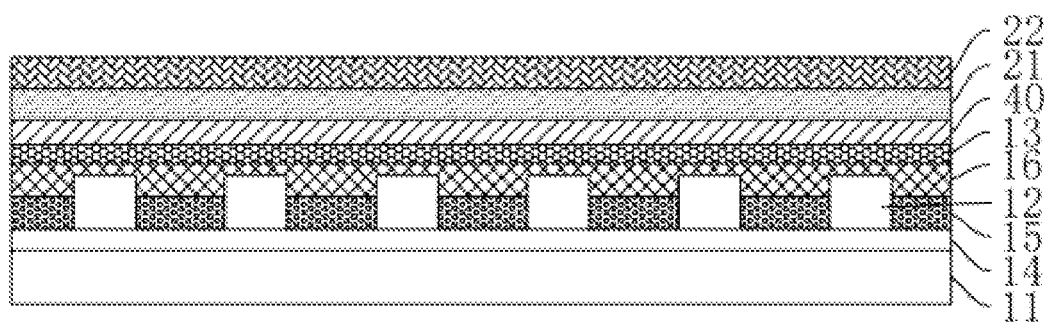

Specifically, please refer to FIG. 3. The quantum-dot thin film includes a quantum-dot layer 21, a common protective functional layer 22 disposed on a side of the quantum-dot layer 21, and a moisture and oxygen blocking release film 23 disposed on a side of the quantum-dot layer 21 away from the common protective functional layer 22.

In the present embodiment, one conventional base material layer is replaced by the moisture and oxygen blocking release film 23 which can block moisture and oxygen. Furthermore, the moisture and oxygen blocking release 23 can be removed in a sequential manufacturing process of the display backplate, thereby reducing a thickness of the quantum-dot module.

Furthermore, a material of the common functional layer 22 may include PET, PMMA, PC, or PEN.

The moisture and oxygen block release film 23 includes a release film main body 231 and a moisture and oxygen blocking layer 232 disposed on a side of the release film main body 231. Wherein, a structure and a material of the release main body 231 may be same as those of common release films. The moisture oxygen blocking layer 232 is disposed on the side of the release film main body 231 away from the quantum-dot layer 21, thereby blocking moisture and oxygen.

Optionally, a material of the moisture and oxygen blocking layer 232 may include at least one of silicon oxide, silicon nitride, or alumina. Furthermore, the moisture and oxygen blocking layer 232 can be formed on the release film main body 231 by sputtering the above materials during manufacturing processes.

Furthermore, an embodiment of the present disclosure provides a method of manufacturing a display backplate which can be formed according to the manufacturing method of the quantum-dot thin film of the above-mentioned embodiments. Therefore, the display backplate of the above-mentioned embodiments can be formed.

Specifically, please refer to FIG. 1, FIG. 3, and FIG. 4. The method of manufacturing the display backplate includes following steps:

Step S10, providing a light-emitting module 10. The light-emitting module 10 includes a light-emitting main body and a composite protective functional layer 13. A surface of a side of the light-emitting main body close to the composite protective functional layer 13 is in contact with and is connected to a surface of a side of the composite protective functional layer 13 close to the light-emitting main body. Wherein, the light-emitting main body includes a substrate 11 and a plurality of light-emitting components 12 formed on the substrate 11. Furthermore, the composite protective functional layer 13 covers the light-emitting components 12.

Step S20, providing a quantum-dot module 20. The quantum-dot module 20 includes a quantum-dot layer 21 and a common protective functional layer 22 which are stacked. A thickness of the composite protective functional layer 13 is less than a thickness of the common protective functional layer 22.

Step S30, attaching a side of the light-emitting module 10 having the composite protective functional layer 13 to a side of the quantum-dot module 20 having the quantum-dot layer 21 to form the display backplate.

Please refer to FIG. 1, FIG. 3, and FIGS. 5A to 5E. In one embodiment of the present disclosure, the method of manufacturing the display backplate includes following steps:

Specifically, providing the substrate 11, and forming a reflective layer 14 on the substrate 11. A material of the reflective layer 14 may be a white ink material, which is not limited here. The light-emitting components 12 may be a plurality of blue LED lamp components arranged on the substrate 11 in an array manner, thereby emitting blue light. Furthermore, the light-emitting components 12 may be a plurality of blue mini LED lamp components, thereby further improving a light-emitting effect of the display backplate provided by the embodiment of the present disclosure.

Then, forming an encapsulation adhesive layer 15 on the substrate 11. The encapsulation adhesive layer 15 is formed between the light-emitting components 12 adjacent to each other, thereby fixing the light-emitting components 12. Wherein, a plurality of second diffusion particles are distributed in the encapsulation adhesive layer 15, thereby diffusing light emitted from the light-emitting components 12.

Optionally, a material of the second diffusion particles includes at least one of an organic diffusion particle or an inorganic diffusion particle. Specifically, the organic diffusion particle may include a silicone material, a polystyrene material, or a polycarbonate material. The inorganic diffusion particle may include $TiO_2$, $ZrO_2$, $Al_2O_3$, or $BaTiO_3$.

Then, forming a light extraction layer 16 on a side of the encapsulation adhesive layer 15 away from the substrate 11. The light extraction layer 16 covers an upper surface of the light-emitting components 12 and fills between the light-emitting components 12 adjacent to each other. Wherein, the light extraction layer 16 includes a material having high refractive index. Specifically, a refractive index of the material of the light extraction layer 16 is greater than or equal to 1.2.

Then, providing a base material. The base material includes PET, PMMA, PC, or PEN. It should be noted that, in the present embodiment, a plurality of first diffusion particles are further mixed in the base material. Optionally, a material of the first diffusion particles includes at least one of an organic diffusion particle or an inorganic diffusion particle. Specifically, the organic diffusion particle may include a silicone material, a polystyrene material, or a polycarbonate material. The inorganic diffusion particle may include $TiO_2$, $ZrO_2$, $Al_2O_3$, or $BaTiO_3$.

The base material may be coated on a side of the light extraction layer 16 away from the substrate 11. Then, the base material is laminated to form a film, thereby obtaining the composite protective functional layer 13. In the present disclosure, a thickness of the composite protective functional layer 13 is effectively reduced because of a lamination process. Furthermore, the first diffusion particles are distributed in the composite protective functional layer 13. Cooperation between the light extraction layer 16 having the material having high refractive index and the composite protective functional layer 13 can further improve uniformity of mixing light emitted from the display backplate. Also, a light extraction rate can be increased. Therefore, diffusion plates disposed in conventional backlight modules can be omitted. In conventional display modules, a diffusion plate is disposed on a lamp plate, leading to a relatively great thickness. In the present embodiment, the light extraction layer 16 is directly disposed between the light-emitting components 12 and is directly disposed on the upper surface of the light-emitting components. The composite protective functional layer 13 is directly laminated on the light extraction layer 16. Therefore, a thickness of the light extraction layer 16 and a thickness of the composite protective functional layer 13 can be significantly reduced, making a total thickness of the light extraction layer 16 and the composite protective functional layer 13 less than a thickness of conventional diffusion plates. This can reduce a thickness of the display backplate by 50 μm to 100 μm.

Providing the quantum-dot thin film of the above-mentioned embodiment. The quantum-dot thin film includes the quantum-dot layer 21, and a common protective functional layer 22 and a moisture and oxygen blocking release film 23 which are respectively disposed on two sides of the quantum-dot layer 21.

Removing the moisture and oxygen blocking release film 23 to form the quantum-dot module 20.

Attaching the side of the light-emitting module 10 having the composite protective functional layer 13 to the side of the quantum-dot module 20 having the quantum-dot layer 21, and attaching a brightness enhancement film 30 to a side of the common protective functional layer 22 away from the light-emitting module 10, thereby forming the display backplate.

Please refer to FIG. 2, FIG. 3, and FIGS. 6A to 6E. In another embodiment of the present disclosure, the method of manufacturing the display backplate includes following steps:

Specifically, providing the substrate 11, and forming a reflective layer 14 on the substrate 11. A material of the reflective layer 14 may be a white ink material, which is not limited here. The light-emitting components 12 may be a plurality of blue LED lamp components arranged on the substrate 11 in an array manner, thereby emitting blue light. Furthermore, the light-emitting components 12 may be a plurality of blue mini LED lamp components, thereby further improving a light-emitting effect of the display backplate provided by the embodiment of the present disclosure.

Then, forming an encapsulation adhesive layer 15 on the substrate 11. The encapsulation adhesive layer 15 is formed between the light-emitting components 12 adjacent to each other, thereby fixing the light-emitting components 12. Wherein, a plurality of second diffusion particles are distributed in the encapsulation adhesive layer 15, thereby diffusing light emitted from the light-emitting components 12.

Optionally, the first diffusion particles and the second diffusion particles are individually selected from at least one of an organic diffusion particle or an inorganic diffusion particle. Specifically, the organic diffusion particle may include a silicone material, a polystyrene material, or a polycarbonate material. The inorganic diffusion particle may include $TiO_2$, $ZrO_2$, $Al_2O_3$, or $BaTiO_3$.

Then, forming a light extraction layer 16 on a side of the encapsulation adhesive layer 15 away from the substrate 11. The light extraction layer 16 covers an upper surface of the light-emitting components 12 and fills between the light-emitting components 12 adjacent to each other. Wherein, the light extraction layer 16 includes a material having high refractive index. Specifically, the refractive index of the material of the light extraction layer 16 is greater than or equal to 1.2.

Then, providing a base material. The base material includes PET, PMMA, PC, or PEN. It should be noted that, in the present embodiment, a plurality of first diffusion particles are further mixed in the base material. Optionally, a material of the first diffusion particles includes at least one of an organic diffusion particle or an inorganic diffusion particle. Specifically, the organic diffusion particle may include a silicone material, a polystyrene material, or a polycarbonate material. The inorganic diffusion particle may include $TiO_2$, $ZrO_2$, $Al_2O_3$, or $BaTiO_3$.

The base material may be coated on a side of the light extraction layer 16 away from the substrate 11. Then, the base material is laminated to form a film, thereby obtaining the composite protective functional layer 13. In the present disclosure, a thickness of the composite protective functional layer 13 is effectively reduced because of a lamination process. Furthermore, the first diffusion particles are distributed in the composite protective functional layer 13. Cooperation between the light extraction layer 16 having the material having high refractive index and the composite protective functional layer 13 can further improve uniformity of mixing light emitted from the display backplate. Also, a light extraction rate can be increased. Therefore, diffusion plates disposed in conventional backlight modules can be omitted. In conventional display modules, a diffusion plate is disposed on a lamp plate, leading to a relatively great thickness. In the present embodiment, the light extraction layer 16 is directly disposed between the light-emitting components 12 and is directly disposed on the upper surface of the light-emitting components. The composite protective functional layer 13 is directly laminated on the light extraction layer 16. Therefore, a thickness of the light extraction layer 16 and a thickness of the composite protective functional layer 13 can be significantly reduced, making a total thickness of the light extraction layer 16 and the composite protective functional layer 13 less than a thickness of conventional diffusion plates. This can reduce a thickness of the display backplate by 50 μm to 100 μm.

Providing the quantum-dot thin film of the above-mentioned embodiment. The quantum-dot thin film includes the quantum-dot layer 21, and a common protective functional layer 22 and a moisture and oxygen blocking release film 23 which are respectively disposed on two sides of the quantum-dot layer 21.

Removing the moisture and oxygen blocking release film 23 to form the quantum-dot module 20.

Then, attaching a blue-light-transmitting film 40 to a side of the quantum-dot module 20 having the quantum-dot layer 21.

Attaching a side of the light-emitting module 10 having the composite protective functional layer 13 to the side of the quantum-dot module 20 having the blue-light-transmitting film 40, and attaching a brightness enhancement film 30 to a side of the common protective functional layer 22 away from the light-emitting module 10, thereby forming the display backplate.

In summary, in the embodiment provided by the present disclosure, the composite protective functional layer 13 is disposed in the light-emitting module 10. The quantum-dot module 20 includes the quantum-dot layer 21 and the common protective functional layer 22 which are stacked. The thickness of the composite protective functional layer 13 is less than the thickness of the common protective functional layer 22. In conventional technologies, two base material layers are respectively disposed on two sides of a quantum-dot thin film. The base material layers must be enough thick to protect and support the quantum-dot thin film. On the contrary, in the present embodiment, since the composite protective functional layer 13 is directly disposed in the light-emitting module 10, it is not necessary to consider functions of the composite protective functional layer 13 to protect and support the quantum-dot module 20 and the quantum-dot layer 21. As such, the composite protective functional layer 13 can be thinner. For example, the composite protective functional layer 13 can be directly formed in the light-emitting module 10 by a lamination process or a coating process. Therefore, the thickness of the composite protective functional layer 13 can be less than the thickness of the common protective functional layer 22 disposed in the quantum-dot module 20 and is less than the thickness of the base material layers disposed on two sides of the conventional quantum-dot thin film. As such, an entire thickness of the display panel can be reduced, thereby satisfying requirements of backlights having a thin and light body.

In addition, an embodiment of the present disclosure further provides a display device. The display device includes a display panel and the display backplate of the above-mentioned embodiments. The display backplate is disposed on a side of the display panel, thereby providing backlight for the display panel.

In the above embodiments, the focus of each embodiment is different, and for a part that is not detailed in an embodiment, reference may be made to related descriptions of other embodiments.

A quantum-dot thin film, a display backplate, and a manufacturing method of the display backplate have been described in detail with embodiments provided by the present disclosure which illustrates principles and implementations thereof. However, the description of the above embodiments is only for helping to understand the technical solution of the present disclosure and core ideas thereof, and it is understood by those skilled in the art that many changes and modifications to the described embodiment can be carried out without departing from the scope and the spirit of the disclosure that is intended to be limited only by the appended claims.

What is claimed is:

1. A display backplate, comprising:
a light-emitting module, comprising a light-emitting main body and a composite protective functional layer, wherein a surface of a side of the light-emitting main body close to the composite protective functional layer is in contact with and is connected to a surface of a side of the composite protective functional layer close to the light-emitting main body, the light-emitting main body comprises a substrate, a plurality of light-emitting components disposed on the substrate, and a light extraction layer disposed on the light-emitting components, and the composite protective functional layer covers the light-emitting components and the light extraction layer; and
a quantum-dot module disposed on the light-emitting module, wherein the quantum-dot module comprises a quantum-dot layer disposed on the composite functional layer and a common protective functional layer disposed on a side of the quantum-dot layer away from the composite protective functional layer, and a thickness of the composite protective functional layer is less than a thickness of the common protective functional layer;
wherein a plurality of first diffusion particles are distributed in the composite protective functional layer.

2. The display backplate of claim 1, wherein a difference between the thickness of composite protective functional layer and the thickness of the common protective functional layer is greater than 5 µm.

3. The display backplate of claim 1, wherein light-emitting main body comprises an encapsulation adhesive layer disposed on the substrate, the encapsulation adhesive layer is disposed between the light-emitting components adjacent to each other, and a plurality of second diffusion particles are distributed in the encapsulation adhesive layer.

4. The display backplate of claim 1, wherein the composite protective functional layer covers an upper surface of the light-emitting components and fills between the light-emitting components adjacent to each other.

5. The display backplate of claim 1, wherein the light extraction layer covers an upper surface of the light-emitting components and fills between the light-emitting components adjacent to each other.

6. The display backplate of claim 1, wherein a refractive index of a material of the light extraction layer is greater than or equal to 1.2.

7. The display backplate of claim 1, wherein the light-emitting components comprise a blue light-emitting diode (LED) component, and the display backplate comprises a blue-light-transmitting film disposed between the light-emitting module and the quantum-dot module.

8. A display backplate, comprising:
a light-emitting module, comprising a light-emitting main body and a composite protective functional layer, wherein a surface of a side of the light-emitting main body close to the composite protective functional layer is in contact with and is connected to a surface of a side of the composite protective functional layer close to the light-emitting main body, the light-emitting main body comprises a substrate, a plurality of light-emitting components disposed on the substrate, and a light extraction layer disposed on the light-emitting components, and the composite protective functional layer covers the light-emitting components and the light extraction layer; and
a quantum-dot module disposed on the light-emitting module, wherein the quantum-dot module comprises a quantum-dot layer disposed on the composite functional layer and a common protective functional layer disposed on a side of the quantum-dot layer away from the composite protective functional layer, and a thickness of the composite protective functional layer is less than a thickness of the common protective functional layer;
wherein the light-emitting main body comprises an encapsulation adhesive layer disposed between the substrate and the light extraction layer, the encapsulation adhesive layer is disposed between the light-emitting components adjacent to each other, and a plurality of diffusion particles are distributed in the encapsulation adhesive layer.

9. The display backplate of claim 8, wherein a difference between the thickness of composite protective functional layer and the thickness of the common protective functional layer is greater than 5 µm.

10. The display backplate of claim 8, wherein the light extraction layer covers an upper surface of the light-emitting components and fills between the light-emitting components adjacent to each other.

11. The display backplate of claim 8, wherein a refractive index of a material of the light extraction layer is greater than or equal to 1.2.

12. The display backplate of claim 8, wherein the light-emitting components comprise a blue light-emitting diode (LED) component, and the display backplate comprises a blue-light-transmitting film disposed between the light-emitting module and the quantum-dot module.

13. A display backplate, comprising:
a light-emitting module, comprising a light-emitting main body and a composite protective functional layer, wherein a surface of a side of the light-emitting main body close to the composite protective functional layer is in contact with and is connected to a surface of a side of the composite protective functional layer close to the light-emitting main body, the light-emitting main body comprises a substrate, a plurality of light-emitting components disposed on the substrate, and a light extraction layer disposed on the light-emitting components, and the composite protective functional layer covers the light-emitting components and the light extraction layer; and
a quantum-dot module disposed on the light-emitting module, wherein the quantum-dot module comprises a quantum-dot layer disposed on the composite functional layer and a common protective functional layer disposed on a side of the quantum-dot layer away from the composite protective functional layer, and a thickness of the composite protective functional layer is less than a thickness of the common protective functional layer;

wherein the light extraction layer covers an upper surface of the light-emitting components and fills between the light-emitting components adjacent to each other.

14. The display backplate of claim 13, wherein a difference between the thickness of composite protective functional layer and the thickness of the common protective functional layer is greater than 5 μm.

15. The display backplate of claim 13, wherein a refractive index of a material of the light extraction layer is greater than or equal to 1.2.

16. The display backplate of claim 13, wherein the light-emitting components comprise a blue light-emitting diode (LED) component, and the display backplate comprises a blue-light-transmitting film disposed between the light-emitting module and the quantum-dot module.

* * * * *